US006553526B1

(12) United States Patent
Shephard, III

(10) Patent No.: US 6,553,526 B1
(45) Date of Patent: Apr. 22, 2003

(54) PROGRAMMABLE ARRAY BUILT-IN SELF TEST METHOD AND SYSTEM FOR ARRAYS WITH IMBEDDED LOGIC

(75) Inventor: Philip George Shephard, III, Round Rock, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/435,873

(22) Filed: Nov. 8, 1999

(51) Int. Cl.[7] ............................ G06F 11/00; G11C 29/00; H03M 13/00
(52) U.S. Cl. ...................... 714/733; 714/736; 714/820; 714/719
(58) Field of Search ................................ 714/733, 736, 714/820, 734, 735, 738, 743, 718, 719, 824, 42, 43

(56) References Cited

U.S. PATENT DOCUMENTS

| | | | |
|---|---|---|---|
| 4,835,774 A | * 5/1989 | Ooshima et al. | 714/719 |
| 5,173,906 A | 12/1992 | Dreibelbis et al. | 371/22.5 |
| 5,577,050 A | * 11/1996 | Bair et al. | 714/710 |
| 5,633,877 A | 5/1997 | Shephard, III et al. | 371/22.2 |
| 5,812,469 A | 9/1998 | Nadeau-Dostie et al. | 365/201 |
| 5,974,579 A | * 10/1999 | Lepejian et al. | 714/733 |
| 6,061,813 A | * 5/2000 | Goishi | 714/718 |
| 6,321,320 B1 | * 11/2001 | Fleischman et al. | 711/217 |

* cited by examiner

Primary Examiner—Christine T. Tu
(74) Attorney, Agent, or Firm—Richard F. Frankeny; Winstead Sechrest & Minick P.C.; Casimer K. Salys

(57) ABSTRACT

The present invention discloses a method and system for testing imbedded logic arrays. An imbedded logic array is first tested for read/write functionality and then a test sequence is run to test the imbedded logic function. The method of the present invention writes a first data pattern to all addresses in an imbedded logic array. Next a second data pattern is written to a specific address followed by a read selecting all addresses concurrently. The output of the imbedded logic array, during this test, is the logic combination of the first data pattern and the second data pattern at the address where the second data pattern was written. By comparing the imbedded logic array output to an expected output the imbedded logic of the array is tested. The present invention anticipates imbedded logic arrays where the expected data output is not a previously written pattern. A programmable expect generator (PEG) is added that generates expected patterns of output for comparison to the actual outputs of an imbedded logic array. In this embodiment of the present invention the same programmable Array Built-In Self Test (PABIST) system used to test the read/write functionality may be used to facilitate testing of the imbedded logic function of an imbedded logic array.

32 Claims, 7 Drawing Sheets

PROGRAMMABLE ARRAY BUILT-IN SELF TEST METHOD AND SYSTEM FOR ARRAYS WITH IMBEDDED LOGIC

CROSS-REFERENCE TO RELATED APPLICATION

The present application is related to U.S. patent application Ser. No. 09/435,875, entitled "Programmable Array Built-in Self Test Method and Controller with Programmable Expect Generator," which is hereby incorporated by reference herein.

TECHNICAL FIELD

The present invention relates, in general, to data processing systems and in particular to Array Built-In Self Test (ABIST) and improved programmable ABIST for integrated circuit special arrays used to make the processor incorporated in the data processing system.

BACKGROUND INFORMATION

In general, integrated circuit arrays (e.g., memory arrays) are tested by providing a known data input at a known address to the array and comparing the output to the expected output. One well known and widely used system for testing integrated circuit logic, particularly integrated circuit memory arrays, is to form a dedicated test circuit on the chip with the array itself. This Array Built-In Self Test (ABIST) technology allows high speed testing of the array without having to force correspondence between the array and the input/output connections to the chip itself. In order to provide high speed testing and to confine the test system to a minimum area of the chip, early ABIST systems had hardwired circuits for generation of test data, generation of control sequences, and test data gathering. However changes in the structure and types of arrays in integrated circuit chips required special hardware for each type of array tested and for the varied expected failure conditions. Improvements in ABIST followed when the control sequences and test patterns were generated by a programmable ABIST (PABIST) systems. PABIST systems allowed a programmable controller with an instruction storage space to be loaded with instructions via a level sensitive scan device (LSSD).

A PABIST system tests an array by executing a sequence of instructions to generate test patterns for an array, testing results and scanning out the test results also using a LSSD. With a suitable instruction set, control of how the sequence was executed and incorporating methods for changing instruction sequence, a sophisticated and powerful PABIST was possible. Programmability enabled a standard test system to be integrated onto integrated circuits for testing a variety of array types and variety of failure modes. PABIST also allowed new tests to be developed and used without modifying the hardwired circuits of the integrated circuit chip.

Some arrays in VLSI circuits have imbedded logic functions that are not separable from the array itself. In the past thorough testing of these arrays has not been possible. Incorporating circuits to isolate the imbedded logic functions adds complexity to the special arrays with imbedded logic. Enabling the test of special arrays within VLSI is an important part of a thorough test plan using PABIST especially where it is desirable to multiplex a PABIST for the testing of many internal arrays.

Clearly there is a need to improve the programmable ABIST system to deal with increased array complexity and the complexity of test patterns and sequences needed to test the failure modes of the arrays. It is also important to enable the PABIST system to test arrays with imbedded array logic functions.

SUMMARY OF THE INVENTION

Some arrays have imbedded logic on the array output and have a feature that allows multiple addresses to be selected during a read. When multiple addresses are selected during a read, the array output is the logic combination of the selected read addresses. The present invention enables testing of arrays of this type by first testing the array for reads and writes of various data patterns and corresponding sequences of reads and writes where only one address is selected at a time during a read. After the array is tested, a second set of tests is executed where a data patten is initially written to all addresses then subsequently a second data pattern is written to one address and a read is executed with all addresses selected concurrently. The array output data is the logic combination of the data written to one address with the data pattern initially written to all addresses. The expected output for the logic combination is compared to actual array output with all addresses selected concurrently. By writing to all addresses a first data pattern followed by writes of a second data pattern to single addresses, all of the imbedded logic on array outputs may be tested.

The present invention anticipates that special arrays with imbedded logic on array outputs may be read/write functionally tested using an Array Built-In Self-Test (ABIST) method prior to testing of their imbedded logic functions. Different configurations of ABIST may be employed to test an array prior to testing the imbedded logic and still be within the scope of embodiments of the present invention. The read/write functionality of an array with imbedded logic, can be tested with ABIST, programmable ABIST (PABIST) or a PABIST system with a programmable expect generator (PEG).

If the logic on the array outputs, when tested using embodiments of the present invention, does not present outputs that are known as previously written inputs or are not sequentially related to previously written inputs a PEG may be used to generate expected outputs. Those features of the PEG used to test read/write functionality may be used to facilitate, in embodiments of the present invention, testing of imbedded logic functions of special arrays.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
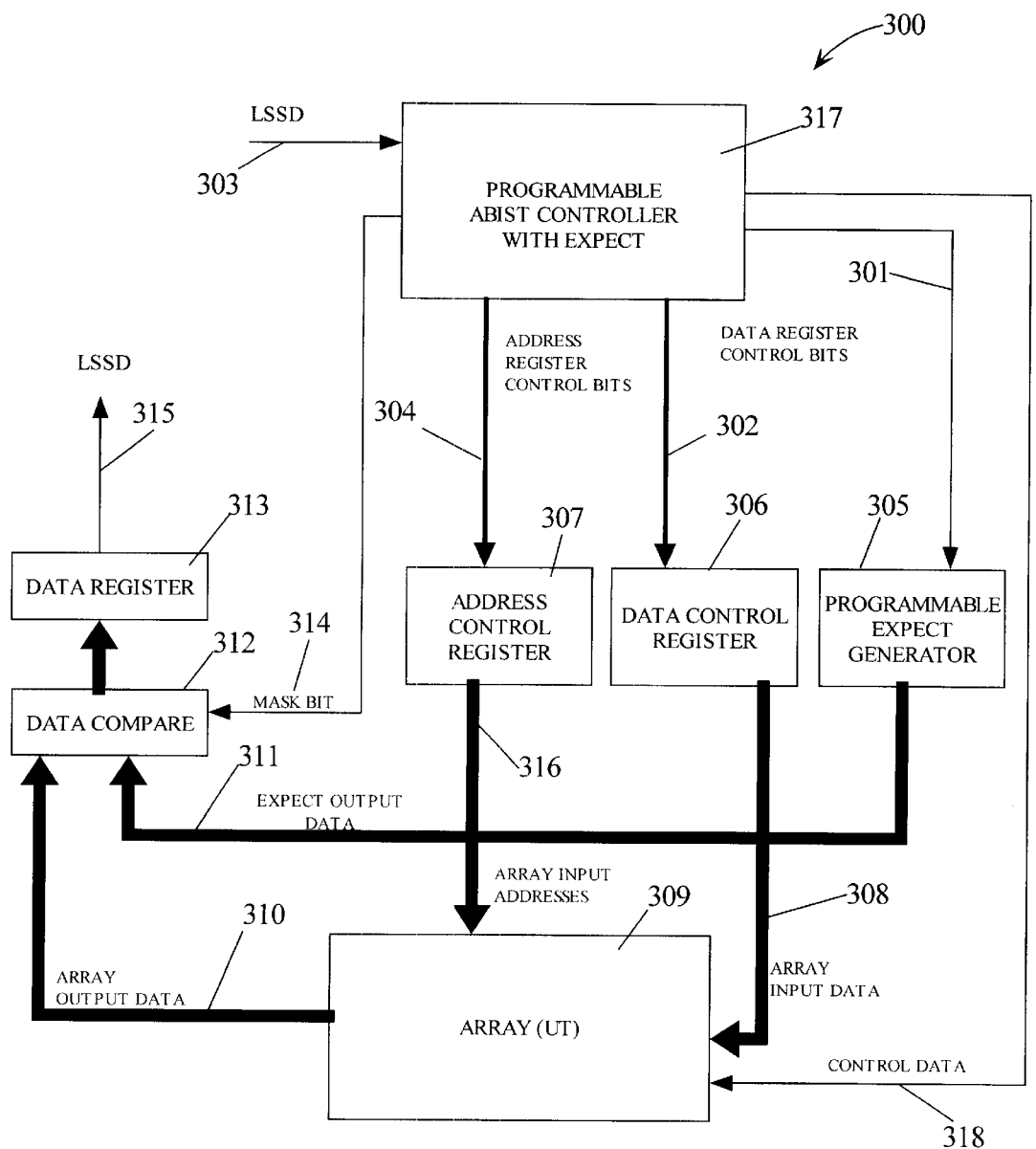
FIG. 1 is a block diagram of a PABIST system using a programmable expect generator of one embodiment of the present invention.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted in as much as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 7:
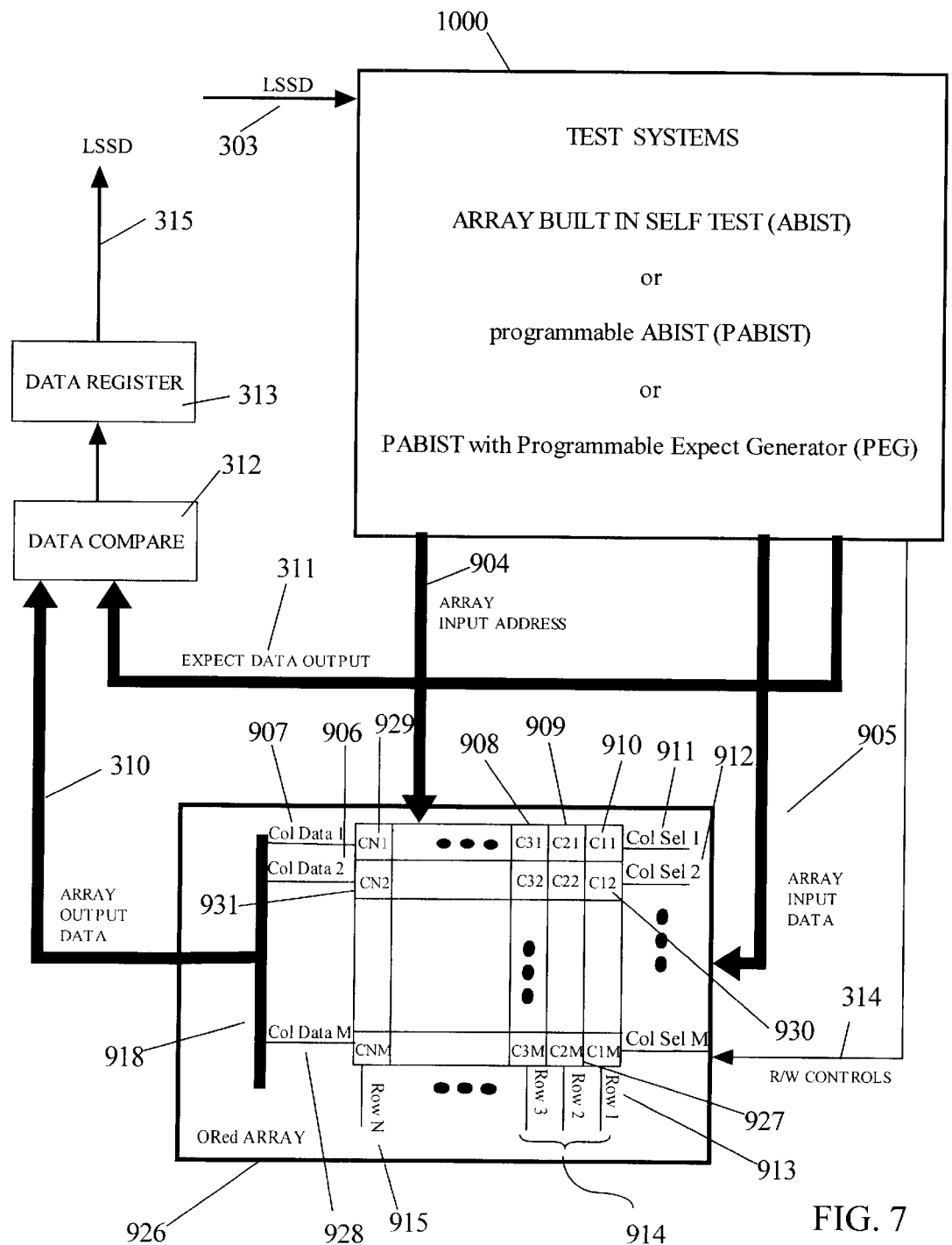
FIG. 7 is an illustration of one embodiment of the present invention showing alternate methods used to test portions of an imbedded logic array.

FIG. 7 illustrates one embodiment of the present invention where one of a multiplicity of test systems 1000 is used to test the read/write functionality of the imbedded logic array 926. LSSD input 303 is one of a selected set of inputs for the test system 1000 depending on the system configuration. After read/write functionality is tested the added test of the present invention is activated. To test the logic on the outputs of imbedded logic array 926, in one embodiment of the present invention, the array is written sequentially with a particular pattern, for example all zeroes. Subsequently a write of another pattern, for example all ones, is written to a single address and a command is issued to read all addresses concurrently. Arrays with imbedded logic which require more than one address be read at a time have the internal logic structure that enables a commanded read of all addresses concurrently. When all addresses are read concurrently in this sequence, the output is the logic combination of the first pattern written to all addresses and the second pattern written to a particular address. Expect data output 311 is compared with the actual array output data 310 in data compare 312. The results of the test are stored in data register 313 and read out with a LSSD 315. By cycling through all the addresses of the array in this manner all of the imbedded logic is tested. Some imbedded logic arrays 926 may allow simple expect output 311 to compare with the array output data 310. An exemplary imbedded logic array 926 has an imbedded OR function its outputs. In the exemplary imbedded logic array 926 with ORed array outputs, the array is initially written with all zeroes and subsequently all ones are written to a particular address. The expect data output, in this example, is also an all ones pattern, the data written to the particular address. In this simple case the expect data output is the same as the data written to a particular address and does not require a more complex method of determining an expected data output.

The following details more complex programmable ABIST (PABIST) systems that may be employed in a unit, for example one of the test systems 1000, to test both the read/write functionality of the imbedded logic array 926 as well as the imbedded logic on the array outputs. A more complex PABIST may be used where the logic functions on the array outputs may not allow simple compares of the array output with an expected output which is a previously written input. Detailed explanation of the operation of imbedded logic array 926 is included in the explanation of FIG. 6 which also incorporates as illustration imbedded logic array 926.

Figure 2:
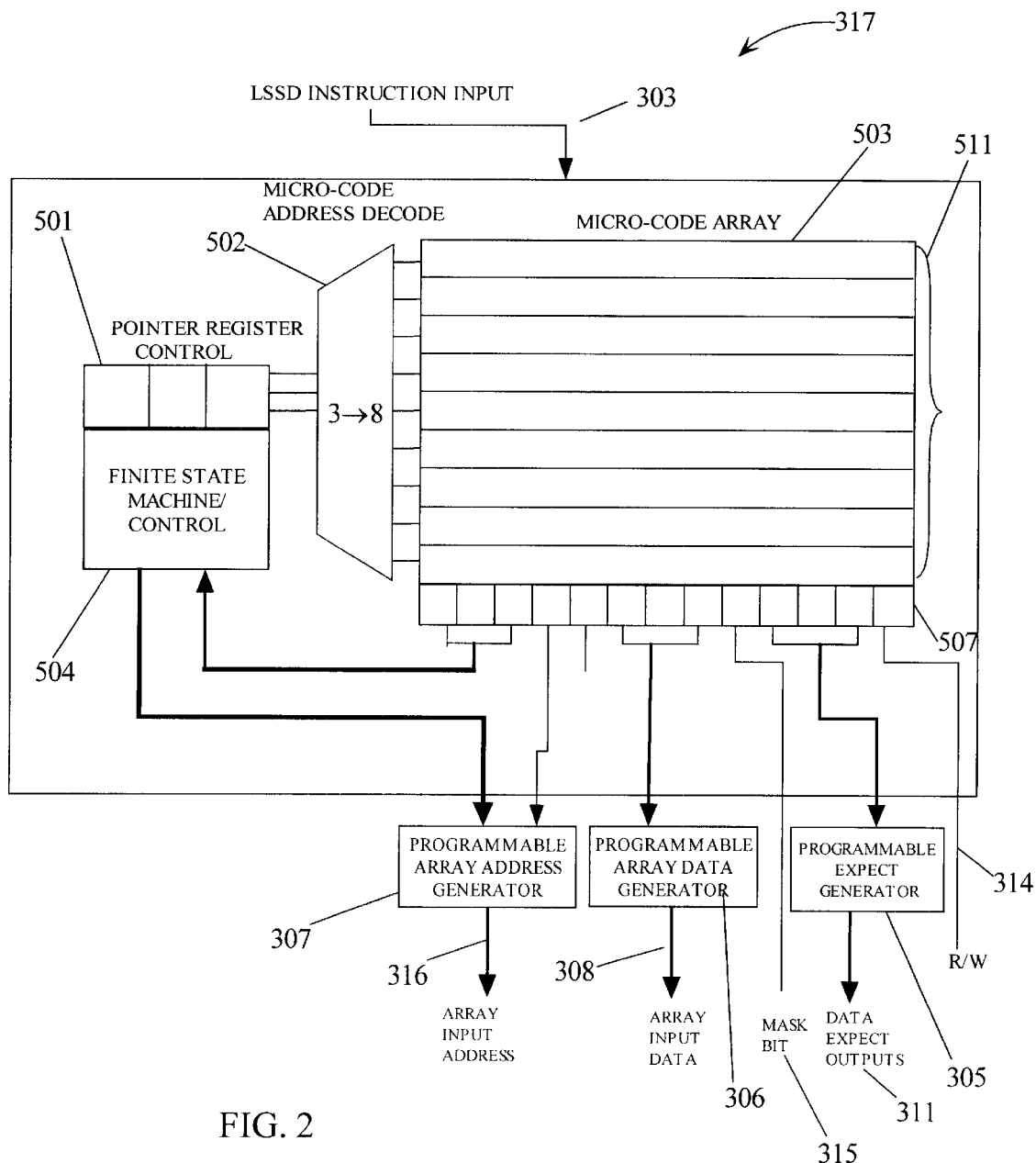
FIG. 2 is a block diagram illustrating a PABIST system and illustrating internal elements in an array with internal imbedded logic.

FIG. 2 is a block diagram of elements of programmable ABIST (PABIST) controller 317 of the present invention. PABIST controller 317 includes a micro-code array 503 that can be loaded with a sequence of instructions 511 via LSSD scan input 303. PABIST controller 317 can execute these instructions 511 using finite state machine/control 504, pointer control register 501 and micro-code address decode 502. Other execution units like branch control (not shown) may be included in the PABIST controller 317. The sequential outputs 507 of the micro-code array 503 have been expanded to include control lines 301 for added programmable expect generator (PEG) 305 and mask bit 314. The outputs 507 are coupled to programmable address generator 307, programmable data generator 306, read/write control 318, and finite state machine/control 504, to generate array addresses 316 and array data 308 and read/write controls 318 that are correspondingly coupled to an array under test (AUT) 309 (see FIG. 1).

FIG. 1 illustrates one embodiment of the present invention which improves a PABIST system 300 with the addition of the programmable expect generator (PEG) 305. PABIST controller 317, address control register 307 and data control register 306 contain embodiments of previously disclosed PABIST systems with the ability to generate complex data patterns and control sequences to test an AUT 309. The addition of a separable PEG 305 improves the state of the art of the illustrative PABIST system 300.

The PEG 305, in one embodiment of the present invention, is a data control register like data control register 306. PEG 305 includes the similar functionality as the data control register 306. Other embodiments of the present invention may use other versions of a PEG which function differently from the data control register. Data control register 306 generates array input data patterns based on decodes of the data register control bits 302. The output of the PABIST controller 317 is expanded to include additional control bits 301 for PEG 305. A sequence of control bits 301 programs PEG 305 to also generate data patterns. Control bits 301 also include a mask bit 314 that is coupled to data compare 312 and may be used to inhibit functions of data compare 312.

When a particular sequence of instructions in PABIST controller 317 is executed, known array output data 310 should result when the address and data patterns of address control register 307 and data control register 306 write to and read from array AUT 309. With the addition of PEG 305, control bits 301 are also programmed to generate an output data sequence from PEG 305 that emulates what an array is "expected" to present on its output when receiving the input test patterns corresponding to a given address, data, and control sequence.

In general PEG 305 may include the ability to delay on a cycle basis its output relative to the array data output. The time required to read out data may take more cycles relative to the time it takes the PEG 305 to generate the expected output for the read. The added feature of a cycle delay or a pipeline enables the array output data the PEG 305 to be time synchronized to enable comparison.

PABIST system 300 may not always be possible to generate address and data input test patterns, with corresponding writes and reads to an array, and at the same time generate a corresponding expected output using the disclosed PEG 305. For those cases where a single pass of a desired test cannot have the PEG 305 generate the corresponding expected output for comparison in data compare 312, the mask bit 314 is included at the proper instruction step and is used to inhibit compare on any known incorrect or non-testable outputs of PEG 305. However, another pass of the desired test sequence can then be executed and a new set of programmed instructions, via data control register bits 301, may be used to direct PEG 305 to generate expected outputs for the missed sequence steps.

With the addition of PABIST controller 317, tests may be changed by scanning in various instructions sets. The PEG 305 may be also programmed to concurrently generate an expected output sequence the same as the output data 310 of AUT 309 receiving the outputs of address and data control registers 306 and 307 and control sequences 318. Using the PEG 305, a multiplicity of tests sequences can be executed in PABIST controller 317 and the output of the PEG 305 can be compared to the output of the AUT 309 in data comparator 312. The addition of PEG 305 allows pass/fail tests results when complex input data patterns and variable sequences of reads and writes are used to test an array. Results of a test are stored in data register 313 and scanned out via LSSD 315.

The addition of PEG 305 allows pass/fail testing of complex sequences of data, addresses and read/write control. This fact again allows the feature of determining the addresses in the array where failure occurred. These "failed addresses" can be recorded in the data compare register by feeding the array address data into the data compare register. In cases where failed addresses are to be recorded cycle delays may have to be incorporated into the path coupling the array address data to the data compare register. The cycle delay enables synchronization of address data and compare of array output data and data expect outputs. The cycle delay may also be incorporated into the data compare register itself.

Depending on the complexity of the arrays and the test patterns to be applied to an array, the PEG 305 can also have varying degrees of complexity. A PEG 305 may be as simple as a programmable counter for some complexity of array testing. In one embodiment of the present invention the PABIST system 300 is used to test many different arrays by having array test data multiplexed to many arrays on an integrated circuit chip. Any array not under test is inhibited from participating in a given array test running on another array.

Figure 3:
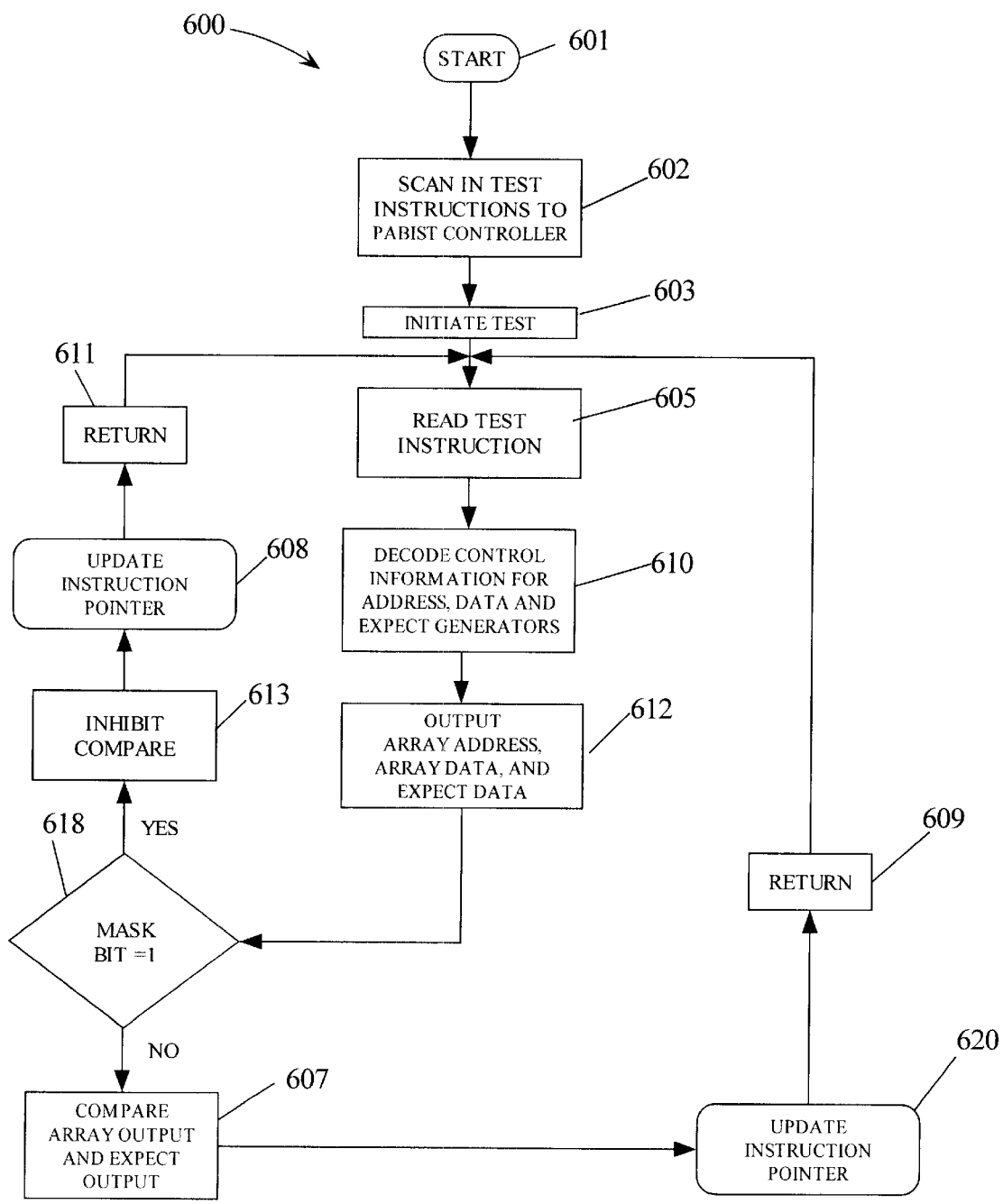
FIG. 3 is a flow diagram illustrating a method for testing an array read/write data patterns using a programmable expect generator.

FIG. 3 is a flow diagram illustrating the PABIST method 600 of the present invention. Exemplary devices referred to in the explanation the method 600 illustrated in FIG. 3 are found in FIG. 2 and FIG. 1. The process begins in step 601. In step 602, instructions are scanned into an exemplary microcode array 503 of PABIST controller 317. A test is initiated in step 603 with a test instruction read in step 605 and decoded in step 610 to generate control bits for controlling exemplary finite state machine controller 504, programmable address generator 307, programmable data generator 306, and programmable expect generator 305, mask bit 314 and read/write control 318 In step 612, the various generators generate in response to the controls, array addresses, array data, read/write, expect data and a mask bit. Step 615 will mask a compare based on the state of the corresponding outputted mask bit. In step 618, if an operation is done with no mask bit, the array output data is compared to the expect generator output in step 607, the results are stored in exemplary data compare register 313 and the instruction counter is updated in step 620 followed by a return 609 to a new test instruction read in step 605. If there is a mask bit present in step 618, the compare (array output and expect output) is inhibited in step 613 and the instruction is updated in step 608 and a return is issued in step 611 to read a new test instruction in step 605.

Figure 6:
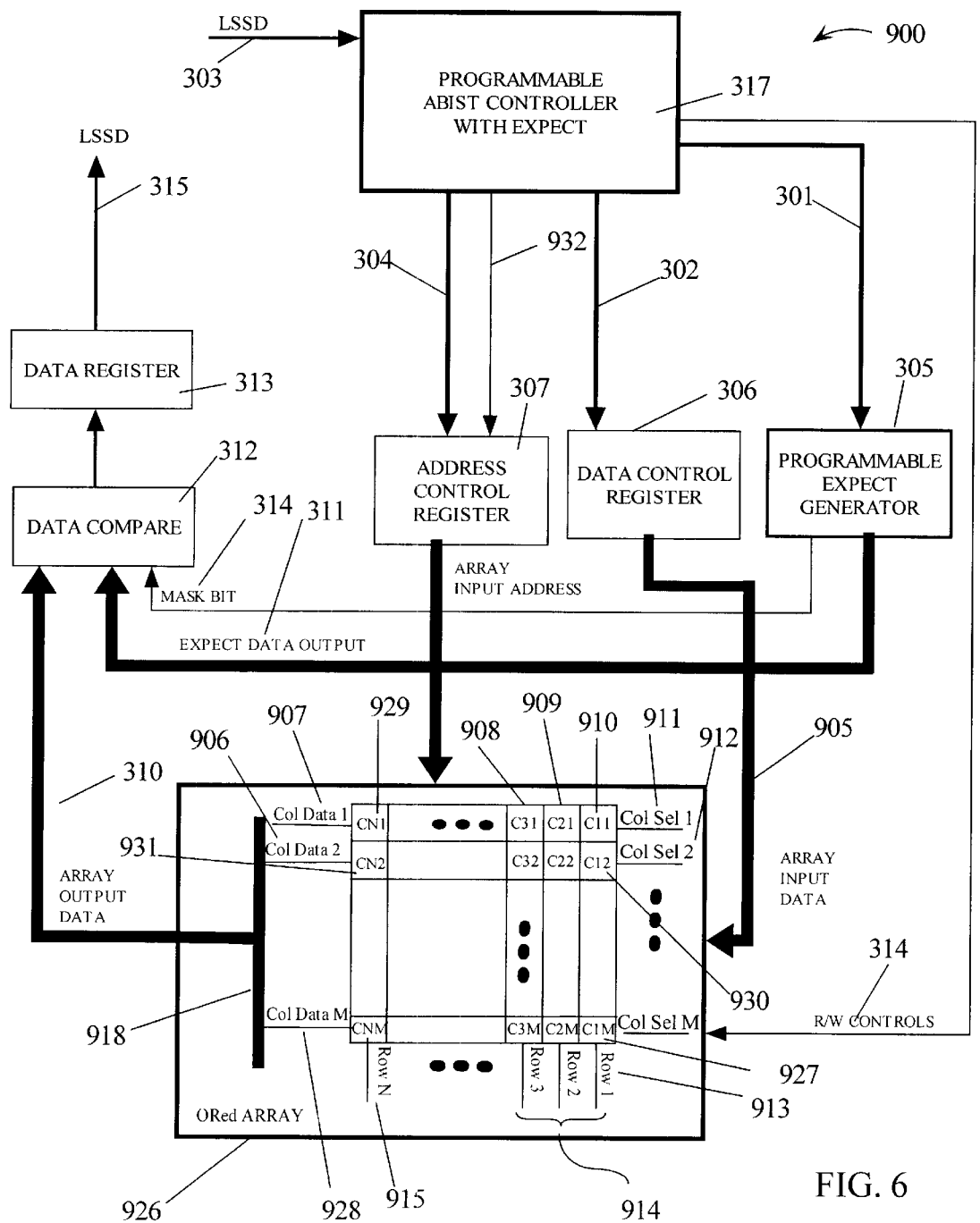
FIG. 6 is a detailed block diagram of elements of a PABIST with the addition of a PEG of the present invention.

FIG. 6 is an illustration of one embodiment of the present invention where a PABIST system 900 is used to test an imbedded logic array 926 which has imbedded logic. The imbedded logic array 926 is shown with row and column select lines. An exemplary row select line Row 1 913 is one of N row select lines in imbedded logic array 926. Exemplary column select line Col Sel 1 912 is one of M column select lines in imbedded logic array 926. Whenever the Row 1 line 913 is selected, all of the column data bits $C_{11}$ 910 through $C_{1M}$ 927 are outputted on bus 918 as Col Data 1 907 through Col Data M 928 as array output data 310. In one embodiment of the present invention the imbedded logic array 926 is implemented such that a multiple row selection, for example Row 1 913 and Row N 915, would OR the data of row 1 and row N and present the ORed data as the array output data 310. If Row 1 913 and Row N 915 were selected concurrently, Col Data 1 907 would equal the OR of $C_{11}$ 910 and $C_{N1}$ 929 while Col Data 2 906 would equal the OR of $C_{12}$ 930 and $C_{N2}$ 931. All the data bits of Col Data 1 through Col Data M would be the corresponding OR of the elements in the rows that were concurrently selected. The logic internal to imbedded logic array 926 that implements the imbedded OR function of the selected rows may be implemented multiple ways and is not the subject of the present invention. However, since the imbedded OR function is used in certain VLSI arrays to facilitate system operation, testing of the function is necessary to insure functionality of the VLSI circuits.

To test an imbedded logic array 926 with an imbedded OR function on the array outputs, PABIST controller 317 would be programmed to test all of the normal array functions selecting only one row at a time at any give read of the imbedded logic array 926. PABIST controller 317 has been modified with the addition of a control line 932 that is operable to select all rows of the array during a read. By selecting all rows, the array output data 310 is an OR of all bits along a column line rows 1 through row N. For example, selecting Row 1 913 and Row N 915 would OR the following; ($C_{11}$ 910 and $C_{N1}$ 907), ($C_{12}$ and $C_{N2}$), through ($C_{1M}$ and $C_{NM}$).

If the imbedded logic array 926 is initially written with all zeros then a read of the imbedded logic array 926, in this embodiment, would generate an all zero array output data 310 on bus 918. To test the OR function PABIST controller 317 is programmed to write data patterns into specific addresses followed by a read selecting all rows concurrently with control bit 932. PEG 305 is also programmed to output expected data output 304 for a successful OR of the data at addresses in which data was written. The program for PABIST controller 317 may cycle through the imbedded logic array 926 writing various patterns into multiple addresses followed by a read selecting all addresses concurrently to determine if all of the imbedded OR logic is functional. Since array data inputs may not be what would be expected during a read, a PEG 305 enables a programmed expect data output to be compared to the array output data in data compare 916. The pass/fail results of the test sequences can be stored in data register 313 and scanned out on LSSD 315.

Arrays that have other imbedded logic functions when multiple rows are selected concurrently, may be tested using the same method. PABIST controller 317 and PEG 305 may be programmed with scanned in instructions for the various tests that are needed. The control lines 310 programming PEG 305 also include masking bit 314 which is operable to inhibit data compare 312 on those sequences where PEG 305 cannot generate all valid expected outputs for a given test program. Another pass of the test program may then be executed with a different program for PEG 305 to test data patterns where output compares were inhibited in the first pass of the test program.

Figure 5:
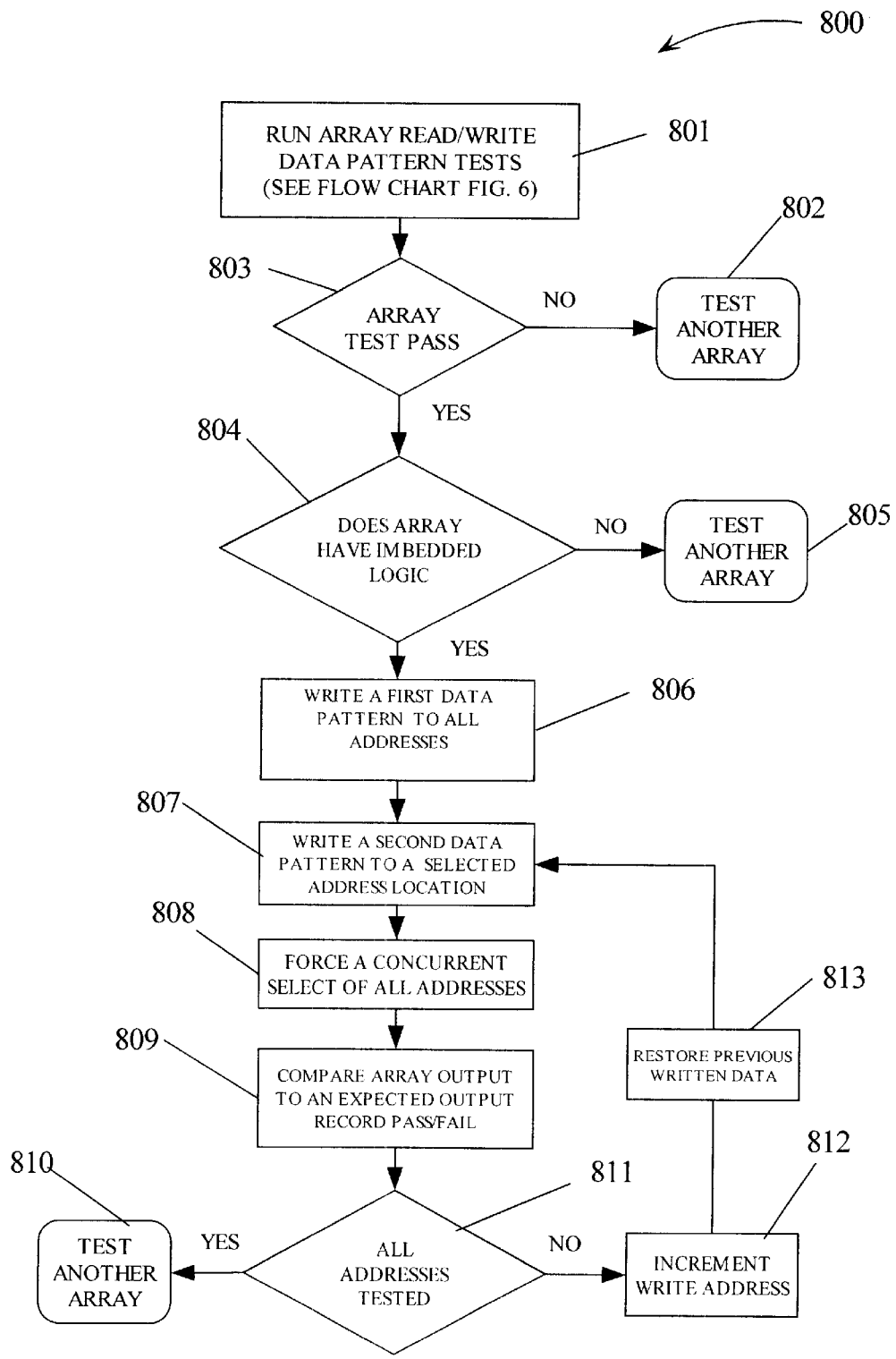
FIG. 5 is a flow diagram of the steps of a method of the present invention for testing an array with imbedded logic functions.

FIG. 5 is flow diagram of a method of testing an array with imbedded logic in one embodiment of the present invention. Step 801 illustrates that before the imbedded logic of an array is tested the array goes through testing for read write data patterns (e.g., the test method illustrated in FIG. 3). If this test is successful (step 803) and if the array in fact has imbedded logic (step 804), the array has a first data pattern written to all addresses in step 806. In step 807 a second data pattern is written to a selected address (for simplicity the first address) followed by a forced read of all addresses concurrently in step 808. An exemplary imbedded logic function is an OR of all outputs that are selected concurrently during a read. In this example, the second data pattern would be an all ones pattern written in step 807, would OR with a first data pattern of all zeroes written in all other addresses in step 806. The output of the array is compared (step 809) to an expected output (in this example all ones) in a data comparator. A pass or fail is recorded. Step 811 tests whether all addresses have been tested and branches to step 810 if the imbedded logic test is complete. In step 810 another imbedded logic test array test could be initiated. If the test is not complete, the write address would be incremented in step 812, the previous written data would be restored in step 813 and a branch to step 807 would again write an all ones pattern in a new address followed by a forced concurrent read of all addresses. In step 802 another array can be tested if a the array fails tests in step 801. In step 805 another array is tested if the current array under test does not have imbedded logic.

Figure 4:
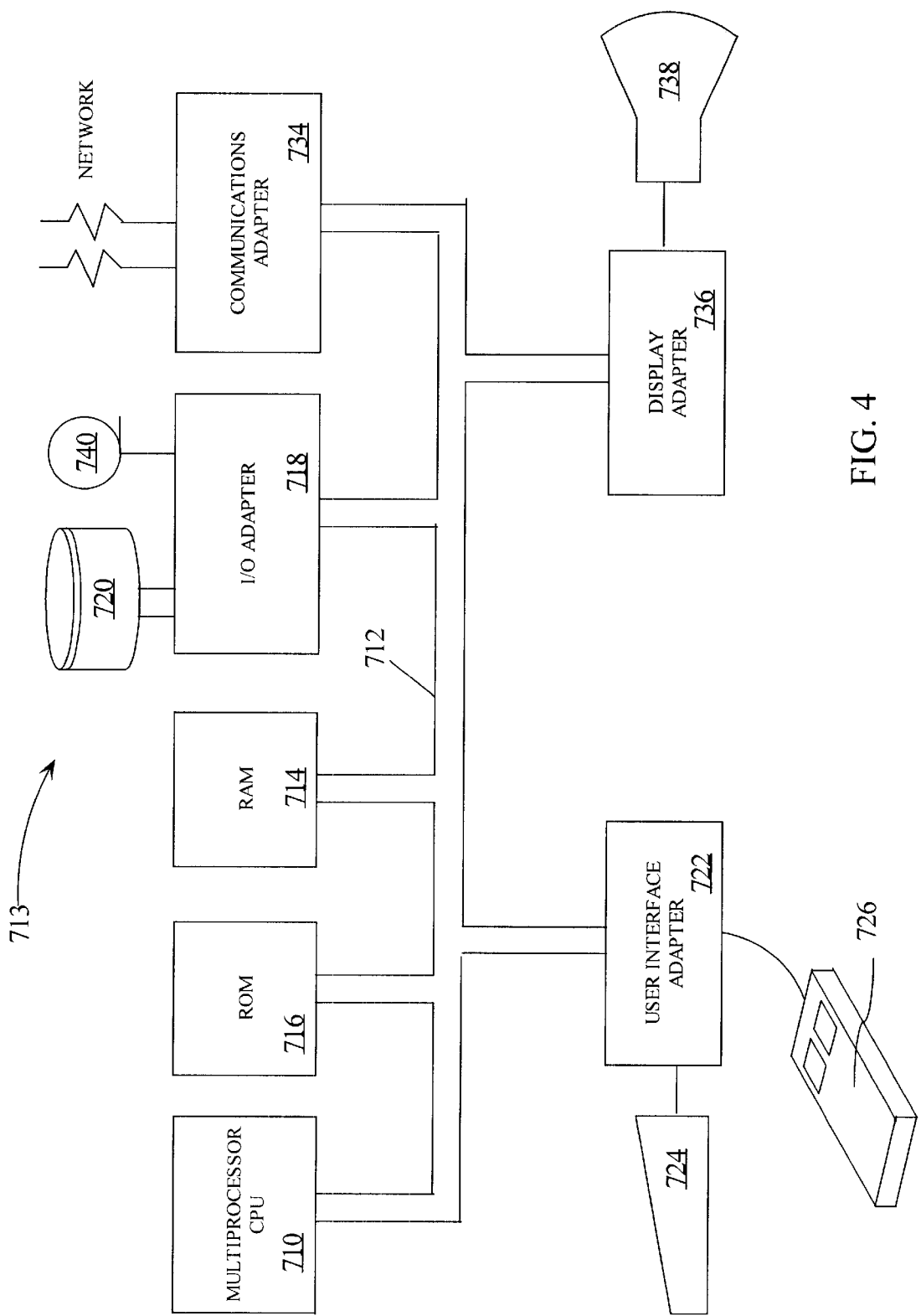
FIG. 4 is a block diagram illustrating a data processing system for use with the present invention.

A representative hardware environment for practicing the present invention is depicted in FIG. 4, which illustrates a typical hardware configuration of data processing system 713 in accordance with the subject invention having central processing unit (CPU) 710, such as a conventional microprocessor, and a number of other units interconnected via system bus 712. Data processing system 713 includes random access memory (RAM) 714, read only memory (ROM) 716, and input/output (I/O) adapter 718 for connecting peripheral devices such as disk units 720 and tape drives 740 to bus 712, user interface adapter 722 for connecting keyboard 724, mouse 726, and/or other user interface devices such as a touch screen device (not shown) to bus 712, communication adapter 734 for connecting data processing system 713 to a data processing network, and display adapter 736 for connecting bus 712 to display device 738. CPU 710 may include other circuitry not shown herein, which will include circuitry commonly found within a microprocessor, (e.g., execution unit, bus interface unit, arithmetic logic unit, etc.). CPU 710 may also reside on a single integrated circuit. System 713 and primarily CPU 710 may contain any number of PABIST systems as described herein.

Although the present invention and its advantages have been described in detail, it should be understood that various changes, substitutions and alterations can be made herein without departing from the spirit and scope of the invention as defined by the appended claims.

What is claimed is:

1. An Array Built-In-Self-Test (ABIST) method for testing a logic function of an imbedded logic array comprising the steps of:

writing a specified first data pattern to all addresses of said imbedded logic array;

writing to one or more addresses of said imbedded logic array with a specified second data pattern;

reading said imbedded logic array while selecting all addresses of said imbedded logic array concurrently;

comparing logic expected data outputs and imbedded logic array outputs of said imbedded logic array; and generating and outputting a sequence of pass/fail results in response to comparing said logic expected data outputs and said imbedded logic array outputs.

2. The method of claim 1, wherein a first test method is executed prior to testing said logic function, said first test method comprising:

testing read/write functionality of said imbedded logic array; and analyzing results of said first test method and configuring logic test instruction sequences for testing said logic function of said imbedded logic array.

3. The method of claim 1, wherein said sequence of pass/fail results are outputted via a level sensitive scan device (LSSD).

4. The method of claim 1, wherein said logic expected data outputs comprise an array input data pattern.

5. The method of claim 1, wherein said logic expected data outputs comprise outputs of a programmable expect data generator.

6. A programmable ABIST (PABIST) method for testing an imbedded logic array comprising the steps of:

(1) executing a PABIST first method for testing an imbedded logic array, said first method further comprising the steps of:

scanning into a programmable ABIST controller a test instruction sequence;

executing said test instruction sequence;

outputting, in response to executing each instruction step in said test instruction sequence, first control bits and second control bits and coupling said first control bits to an expect data generator and coupling said second control bits to an input address generator and an input data generator for said imbedded logic array;

generating expect data outputs from said expect data generator in response to said first control bits concurrent with generating input addresses from said input address generator and input data from said input data generator in response to said second control bits;

generating outputs of said imbedded logic array in response to said input addresses and said input data;

comparing said expect data outputs, said outputs of said imbedded logic array, and selected control bits from said first control bits; and generating and outputting a sequence of pass/fail results in response to said comparison of said expect data outputs, said outputs of said imbedded logic array and said selected control bits;

(2) analyzing said pass/fail results of said first test method and configuring logic test instruction sequences for testing said imbedded logic array; and
(3) executing a second test method, said second test method comprising the steps of:
scanning into said PABIST controller said logic test instruction sequences via a level sensitive scan device (LSSD);
executing said logic test instruction sequences;
writing a specified first data pattern to all addresses of said imbedded logic array;
writing to one or more addresses of said imbedded logic array with a specified second data pattern followed by reading said imbedded logic array while selecting all of said imbedded logic array addresses concurrently;
comparing logic expected data outputs and imbedded logic array outputs from said imbedded logic array; and
generating and outputting a sequence of pass/fail results in response to a compare of said logic expected data outputs and said imbedded logic array outputs.

7. The method of claim 6, wherein said expect data generator is substantially a duplicate of said input data generator with corresponding like control functions.

8. The method of claim 6, wherein said selected control bits comprise a masking bit, said masking bit operable to inhibit or enable a data comparator performing said comparison step.

9. The method of claim 6, wherein said sequence of pass/fail results are outputted via a level sensitive scan device (LSSD).

10. The method of claim 6, wherein said input data generator and said input address generator are control registers.

11. The method of claim 6, wherein said logic expected data outputs comprise an array input data pattern.

12. The method of claim 6, wherein said logic expected data outputs comprise outputs of said programmable expect data generator.

13. An Array Built-In-Self-Test (ABIST) system for testing an imbedded logic array comprising:
ABIST control circuitry for generating array input addresses, array input data, and array read/write controls;
a circuit operable to generate logic expect output data;
a circuit operable to select concurrently all addresses of said imbedded logic array during a read of said imbedded logic array; and
a data comparator for comparing imbedded logic array output data from said imbedded logic array and said logic expect output data, said data comparator generating pass/fail results of said comparing of said imbedded logic array output data and said logic expect output data.

14. The ABIST system of claim 13, further comprising a data register coupled to said data comparator and operable for outputting said results via a level sensitive scan device (LSSD).

15. The ABIST system of claim 13, wherein said imbedded logic array is operable for outputting said imbedded logic array output data in response to receipt of said array input addresses and said array input data, wherein said imbedded logic array is operable to select all addresses currently during said read.

16. A programmable ABIST (PABIST) system for testing an imbedded logic array comprising:
a PABIST controller for generating input address control bits, input data control bits, read/write control bits, and expect control bits in response to executing programmed instructions;
a programmable expect generator (PEG), said PEG receiving said expect control bits and generating corresponding expect output data in response to said expect control bits;
a data comparator, said data comparator comparing imbedded logic array output data from said imbedded logic array, said expect output data, and selected expect control bits of said expect control bits, said data comparator generating pass/fail results of said comparing of said imbedded logic array output data, said expect output data and said selected expect control bits; and
a circuit operable to select concurrently all addresses of said imbedded logic array during a read of said imbedded logic array.

17. The PABIST system of claim 16, wherein said PEG operates in a substantially similar manner as an array input data generator for said imbedded logic array.

18. The PABIST system of claim 16, wherein said selected expect control bits of said expect control bits include a masking bit, said masking bit operable to enable or inhibit said data comparator.

19. The PABIST system of claim 16, further comprising a data register coupled to said data comparator and operable for outputting said results via a level sensitive scan device (LSSD).

20. The PABIST system of claim 16, wherein said PABIST system further comprises:
an array input address generator operable for generating array input addresses in response to receipt of said address control bits; and
an array input data generator operable for generating array input data in response to receipt of said input data control bits.

21. The PABIST system of claim 20, wherein said imbedded logic array is operable for outputting said imbedded logic array output data in response to receipt of said array input addresses and said array input data, and wherein said imbedded logic array is operable to select all addresses currently during said read of said imbedded logic array.

22. The PABIST system of claim 20, wherein said array input address generator and said array input data generator are control registers.

23. A data processing system, comprising:
a central processing unit (CPU);
random access memory (RAM);
read only memory (ROM);
an I/O adapter; and
a bus system coupling said CPU to said ROM, said RAM and said I/O adapter, wherein said CPU and said RAM further comprise imbedded logic arrays with Array Built-In-Self-Test (ABIST), said ABIST comprising:
ABIST control circuitry for generating array input address control bits, array input data control bits, expect control bits and array read/write control bits in response to programmed instructions;
a circuit operable to generate logic expect output data;
a circuit operable to select concurrently all addresses of said imbedded logic array during a read of said imbedded logic array; and a data comparator, said data comparator comparing imbedded logic array output data from one of said imbedded logic arrays, said logic expect output data, said data comparator generating pass/fail results of said comparing of said imbedded logic array output data and said logic expect output data.

24. The data processing system of claim 23, further comprising a data register coupled to said data comparator and operable for outputting said results via a level sensitive scan device (LSSD).

25. The data processing system of claim 23, wherein said imbedded logic array is operable for outputting said imbedded logic array output data in response to receipt of said array input addresses and said array input data, wherein said imbedded logic array is operable to select all addresses currently during said read of said imbedded logic array.

26. A data processing system, comprising:

a central processing unit (CPU);

random access memory (RAM);

read only memory (ROM);

an I/O adapter; and a bus system coupling said CPU to said ROM, said RAM and said I/O adapter, wherein said CPU and said RAM further comprise imbedded logic arrays with programmable Array Built-In-Self-Test (PABIST), said PABIST comprising;

a PABIST controller for generating array input address control bits, array input data control bits, read/write control bits, and expect control bits in response to executing programmed instructions;

a programmable expect generator (PEG), said PEG receiving said expect control bits and generating corresponding expect output data in response to said expect control bits;

a data comparator for comparing imbedded logic array output data from one of said imbedded logic arrays, said expect output data, and selected expect control bits of said expect control bits, said data comparator generating pass/fail results of said comparing of said imbedded logic array output data, said expect output data and said selected expect control bits; and a circuit operable to select concurrently all addresses of said imbedded logic array during a read of said imbedded logic array.

27. The data processing system of claim 26, wherein said PEG operates in a substantially similar manner as an array input data generator for said imbedded logic array under test.

28. The data processing system of claim 26, wherein said selected bits of said expect control bits include a masking bit, said masking bit operable to enable or inhibit said data comparator.

29. The data processing system of claim 26, further comprising a data register coupled to said data comparator and operable for outputting said results via a level sensitive scan device (LSSD).

30. The data processing system of claim 26, wherein said PABIST system further comprises:

an array input address generator operable for generating array input addresses for said imbedded logic array in response to receipt of said array input address control bits; and an array input data generator operable for generating array input data for said imbedded logic array in response to receipt of said array input data control bits.

31. The data processing system of claim 30, wherein said imbedded logic array is operable for outputting said imbedded logic array output data in response to receipt of said array input addresses and said array input data, wherein said imbedded logic array is operable to select all addresses currently during said read of said imbedded logic array.

32. The data processing system of claim 30, wherein said array input address generator and said array input data generator are control registers.

* * * * *